(12) United States Patent
Cao et al.

(10) Patent No.: US 11,224,128 B2
(45) Date of Patent: Jan. 11, 2022

(54) DEVICE AND METHOD FOR MOLDING AN FPC AND A PLASTIC PART

(71) Applicant: DONGGUAN LUXSHARE PRECISION INDUSTRY CO. LTD., Dongguan (CN)

(72) Inventors: Jiaoping Cao, Dongguan (CN); Zhenhua Liu, Dongguan (CN); Yun Feng, Dongguan (CN)

(73) Assignee: DONGGUAN LUXSHARE PRECISION INDUSTRY CO. LTD., Dongguan (CN)

( * ) Notice: Subject to any disclaimer, the term of this patent is extended or adjusted under 35 U.S.C. 154(b) by 0 days.

(21) Appl. No.: 17/007,340

(22) Filed: Aug. 31, 2020

(65) Prior Publication Data
US 2021/0298179 A1 Sep. 23, 2021

(30) Foreign Application Priority Data
Mar. 17, 2020 (CN) .......................... 202010187137.8

(51) Int. Cl.
| | |
|---|---|
| *H05K 1/02* | (2006.01) |
| *H05K 1/09* | (2006.01) |
| *H05K 3/36* | (2006.01) |
| *H05K 3/40* | (2006.01) |
| *H01L 23/31* | (2006.01) |

(Continued)

(52) U.S. Cl.
CPC ......... *H05K 3/0014* (2013.01); *H05K 1/0393* (2013.01); *H05K 3/0091* (2013.01); *H05K 2201/09118* (2013.01)

(58) Field of Classification Search
CPC ............ H05K 1/02; H05K 1/09; H05K 1/023; H05K 1/117; H05K 1/118; H05K 1/189; H05K 1/0216; H05K 1/0265; H05K 3/361; H05K 3/0058; H05K 3/0393; H05K 3/4015; H05K 2201/2009; H05K 2201/09236;

(Continued)

(56) References Cited

U.S. PATENT DOCUMENTS

| | | | |
|---|---|---|---|
| 6,025,562 A | 2/2000 | Shimizu et al. | |
| 6,195,212 B1 * | 2/2001 | Miyamoto | G02B 7/10 359/694 |

(Continued)

FOREIGN PATENT DOCUMENTS

| | | |
|---|---|---|
| CN | 201609950 U | 10/2010 |
| CN | 103481439 A | 1/2014 |

(Continued)

OTHER PUBLICATIONS

Chinese Office Action and Search Report for Chinese Application No. 202010187137.8, dated Jun. 17, 2021, with English translation.

*Primary Examiner* — Xiaoliang Chen
(74) *Attorney, Agent, or Firm* — Birch, Stewart, Kolasch & Birch, LLP

(57) ABSTRACT

Provided are a device and method for molding an FPC and a plastic part, which belongs to the field of FPC processing technology. The method for molding an FPC and a plastic part includes preprocessing a preform and connecting an FPC to the outer cylindrical surface of the preform; and forming a coating on the outer cylindrical surface of the preform by using the device for molding an FPC and a plastic part.

17 Claims, 7 Drawing Sheets

(51) Int. Cl.
*H01L 23/492* (2006.01)
*H05K 3/00* (2006.01)
*H05K 1/03* (2006.01)

(58) Field of Classification Search
CPC .......... H05K 2201/10121; H01L 23/31; H01L 23/492
USPC ................................ 174/255, 254, 257, 258
See application file for complete search history.

(56) References Cited

U.S. PATENT DOCUMENTS

| | | | |
|---|---|---|---|
| 2007/0156208 A1* | 7/2007 | Havell | A61N 5/0616 607/88 |
| 2016/0375617 A1 | 12/2016 | Hutter et al. | |
| 2017/0264801 A1* | 9/2017 | Wang | H01L 27/14634 |
| 2020/0288249 A1* | 9/2020 | Shao | H04R 7/18 |

FOREIGN PATENT DOCUMENTS

| | | |
|---|---|---|
| CN | 107553818 A | 1/2018 |
| CN | 109644573 A | 4/2019 |
| DE | 102009027694 A1 | 1/2011 |
| DE | 102011076747 A1 | 12/2012 |
| JP | 2002-137248 A | 5/2002 |

* cited by examiner

DEVICE AND METHOD FOR MOLDING AN FPC AND A PLASTIC PART

CROSS-REFERENCES TO RELATED APPLICATION

This application claims priority to a Chinese patent application No. 202010187137.8 filed on Mar. 17, 2020, the disclosure of which is incorporated herein by reference in its entirety.

TECHNICAL FIELD

The present disclosure relates to the field of FPC processing technology and, in particular, to a device and method for molding an FPC and a plastic part.

BACKGROUND

A flexible printed circuit board (FPC, also known as flexible board) sticks to a surface of a product generally by being post-processed, for example, glued or hot-pressed. If a structure of the product is curved, the designed FPC needs to have a curve and therefore the adhesion between the FPC and the plastic shell of the product needs to be strong. Glue insufficiency or immature processing technology may cause weak adhesion between the FPC and the plastic shell of product and make the FPC easily separated from the plastic shell. A certain proportion of the weak adhesion may cause upwarp of the FPC damage the functions and seriously affect user experience.

Therefore, a device and method for molding an FPC and a plastic are urgently needed to solve the above problems.

SUMMARY

An object of the present disclosure is to provide a device for molding an FPC and a plastic part. The device can build the FPC into the plastic part and integrally form the FPC and the plastic part, thereby improving the stability of the connection of the FPC and making the performance of FPC better achieved.

Another object of the present disclosure is to provide a method for molding an FPC and a plastic part. The method uses the above device.

To achieve the preceding objects, the present disclosure adopts the technical solutions below.

A device for molding an FPC and a plastic part includes a lower mold assembly, an upper mold assembly, at least one mold core assembly and at least one second mandrel.

The lower mold assembly includes a lower mold.

The upper mold assembly includes an upper mold. The upper mold is disposed facing the lower mold in an up-down direction.

The at least one mold core assembly is disposed between the upper mold and the lower mold. Each mold core assembly includes a first mandrel.

The at least one second mandrel is disposed between the upper mold and the lower mold. Each second mandrel is facing a respective one of the least one mold core assembly.

At least one cavity formed at a junction of the lower mold and the upper mold. Each mold core assembly and the respective second mandrel correspond to a respective one of the least one cavity. Each of the at least one cavity is disposed between the respective mold core assembly and the respective second mandrel and is configured to accommodate a preform which is provided with an outer cylindrical surface and is connected to the FPC. An end of the first mandrel of each mold core assembly and an end of each second mandrel are connectable to two ends of the preform respectively to support the preform in the respective cavity.

The preform, the FPC, the upper mold, the lower mold, each mold core assembly and respective second mandrel form a mold cavity for coating the outer cylindrical surface of the preform. The mold cavity is configured to form a coating on the outer cylindrical surface of the preform to coat the FPC.

Optionally, each of the at least one mold core assembly further includes a fixed block and a movable block connectable to the fixed block. The first mandrel is connected to an end of the fixed block. In a case where the fixed block is connected to the movable block, an installation slot is formed between the fixed block and the movable block. The installation slot is configured to cover a part of the FPC not in contact with the preform.

Optionally, the device further includes a mold bar. A bottom of the upper mold is provided with an upper slot and a top of the lower mold is provided with a lower slot corresponding to the upper slot. The mold bar is disposed between the upper slot and the lower slot. At least one connection slot spaced apart is disposed in the mold bar. The fixed block and the movable block are detachably disposed in a respective connection slot respectively.

Optionally, a gap is provided between a side of the movable block away from the fixed block and an inner wall of the respective connection slot.

Optionally, the lower mold assembly further includes a slider disposed on one side of the lower mold. the other end of each second mandrel is connected to the slider. The slider configured to drive the second mandrel to slide along an axis direction of the second mandrel.

Optionally, the device further comprises a mount disposed on a side of the slider away from the lower mold. A guide pillar penetrating the slider is disposed between the mount and the lower mold.

Optionally, the upper mold assembly further includes a wedge block. The wedge block is connected to a side of the upper mold facing the slider. The wedge block is provided with an upper abutment surface and the slider is provided with a lower abutment surface. The upper abutment surface is configured to drive, by abutting against the lower abutment surface, the slider to move toward the lower mold in a case where the wedge block moves toward the slider.

Optionally, the device further includes a guide plate, wherein the guide plate is clamped between the upper mold and the lower mold and is at a side adjacent to the slider. The second mandrel slides through the guide plate.

A method for molding an FPC and a plastic part includes preprocessing a preform and connecting an FPC to an outer cylindrical surface of the preform, and forming a coating on the outer cylindrical surface of the preform by using the device for molding an FPC and a plastic part.

Optionally, the outer cylindrical surface of the preform is provided with a clamp slot surrounding the preform, and one end of the FPC is disposed around the clamp slot and in the clamp slot for connecting to the preform.

REFERENCE LIST

Figure 1:
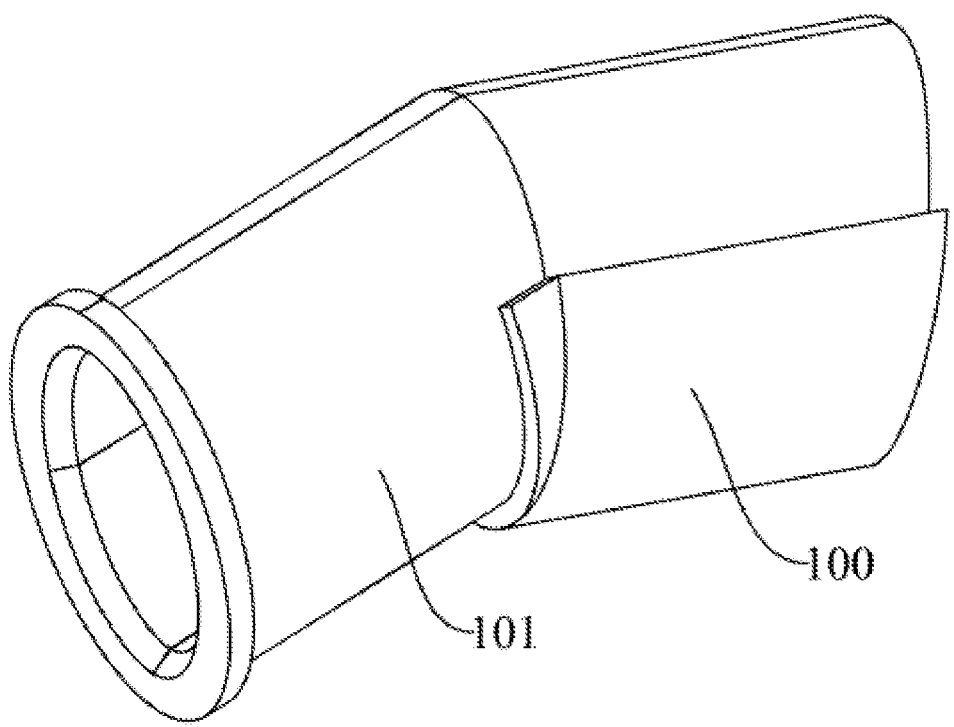
FIG. 1 is a perspective view illustrating the structure of a preform according to an embodiment of the present disclosure.
Figure 2:
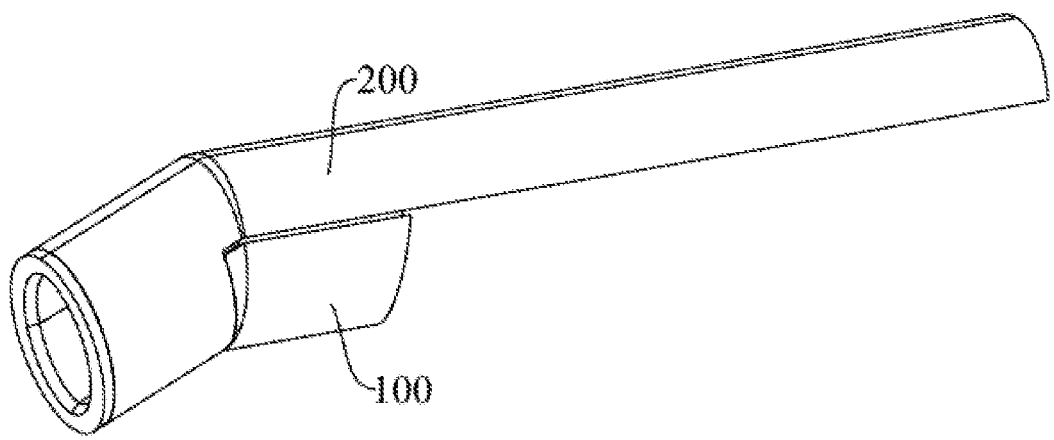
FIG. 2 is a perspective view illustrating the structure of the preform and an FPC according to an embodiment of the present disclosure.

In the drawings:
100 preform
101 clamp slot
200 FPC
300 coating
1 lower mold assembly
11 base
12 lower mold
121 lower slot
13 slider
131 handle
132 lower abutment surface
14 mount
15 guide pillar
2 upper mold assembly
21 wedge block
211 upper abutment surface
22 upper mold holder
23 upper mold
231 upper slot
3 mold bar
31 connection slot
4 guide plate
5 mold core assembly
51 first mandrel
52 fixed block
53 movable block
54 installation slot
6 second mandrel
7 cavity
8 support base

DETAILED DESCRIPTION

In the description of the present disclosure, it is to be noted that orientations or position relations indicated by terms "center", "upper", "lower", "left", "right", "vertical", "horizontal", "in", "out" and the like are orientations or position relations based on the drawings. These orientations or position relations are only for the convenience of describing the present disclosure and simplifying the description and do not indicate or imply that a device or element referred to must have such specific orientations or be configured or operated in such specific orientations. Thus, these orientations or position relations shall not be construed as limiting the present disclosure. In addition, terms "first", "second" and the like are used for the purpose of description and shall not be construed as indicating or implying relative importance. Terms "the first position" and "the second position" are two different positions.

Unless otherwise specified and limited, terms "mounted", "joined", "connected" and "fixed" shall be understood in a broad sense. For example, the term "connected" may refer to "fixedly connected" or "detachably connected". In addition, the term "connected" may refer to "mechanically connected" or "electrically connected". Further, the term "connected" may refer to "connected directly", "connected indirectly through an intermediary", "communicating in two components" or "interacting between two components". For those of ordinary skill in the art, specific meanings of the above terms in the present disclosure may be understood according to specific situations.

Unless otherwise specified and limited, when a first feature is described as "on" or "under" a second feature, the first feature and the second feature may be in direct contact or be in contact via another feature between the two features. Moreover, when the first feature is described as "on", "above" or "over" the second feature, the first feature is right on, above or over the second feature or the first feature is obliquely on, above or over the second feature, or the first feature is simply at a higher level than the second feature. When the first feature is described as "under", "below" or "underneath" the second feature, the first feature is right under, below or underneath the second feature or the first feature is obliquely under, below or underneath the second feature, or the first feature is simply at a lower level than the second feature.

Hereinafter the present disclosure will be further described in detail in conjunction with FIGS. 1 to 11 and embodiments.

Figure 3:
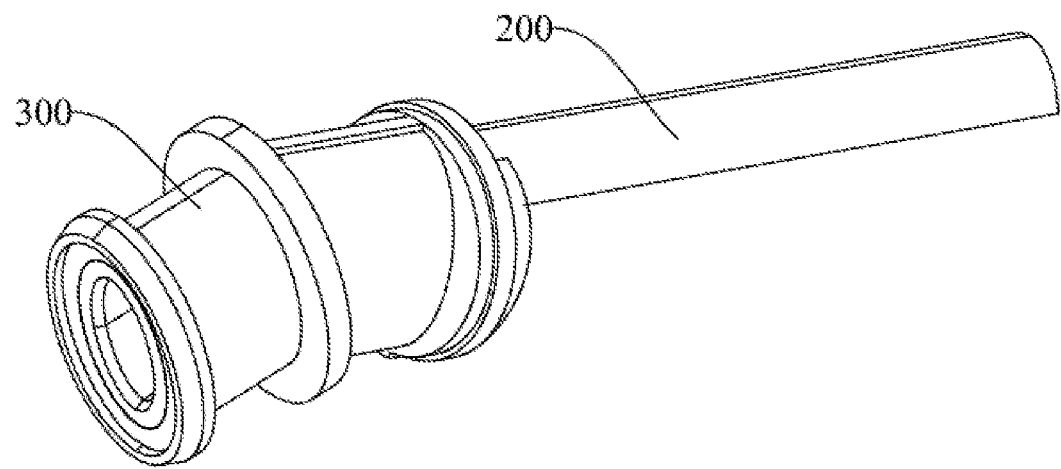
FIG. 3 is a perspective view illustrating the structure of a device for molding an FPC and a plastic part according to an embodiment of the present disclosure.

This embodiment provides a method for molding an FPC and a plastic part. As shown in FIG. 1 and FIG. 3, the method includes preprocessing a preform 100 and connecting an FPC 200 to the outer cylindrical surface of the preform 100; and forming a coating 300 on the outer cylindrical surface of the preform 100 by using the device for molding an FPC and a plastic part.

The FPC 200 is connected between the coating 300 and the preform 100, so that the stability of the connection of the FPC 200 is improved and the performance of FPC 200 is better achieved. Moreover, the arrangement in which the FPC 200 is built into a plastic part formed by the preform 100 and the coating 300 can improve the degree of general integration, reduce the volume of the product and simplify the structure of the product.

Optionally, the outer cylindrical surface of the preform 100 is provided with a clamp slot 101 surrounding the preform 100. An end of the FPC 200 is disposed around the clamp slot 101 and connected into the clamp slot 101. Understandably, connecting the FPC 200 into the clamp slot 101 can be convenient for connecting the FPC 200 and the preform 100, prevent the FPC 200 from sliding along the outer cylindrical surface of the preform 100, and improve the reliability of the connection between the FPC 200 and the preform 100.

As shown in FIG. 3 to FIG. 7, the device for molding an FPC and a plastic part includes a lower mold assembly 1, an upper mold assembly 2, at least one mold core assembly 5 and at least one second mandrel 6. The lower mold assembly 1 includes a lower mold 12. The lower mold is disposed on a base 11.

The upper mold assembly 2 includes an upper mold 23. A top of the upper mold 23 is connected to an upper mold holder 22. The upper mold 23 is disposed facing the lower mold 12 in an up-down direction. The mold core assembly 5 is disposed between the upper mold 23 and the lower mold 12. Each mold core assembly 5 includes a first mandrel 51. The second mandrel 6 is disposed between the upper mold 23 and the lower mold 12. Each second mandrel 6 is facing a respective mold core assembly 5. At least one cavity 7 formed at a junction of the lower mold 12 and the upper mold 23. Each mold core assembly 5 and the respective second mandrel 6 facing a respective one of the at least one cavity 7. Each of the at least one cavity 7 is disposed between the respective mold core assembly 5 and the respective second mandrel 6. The cavity 7 is used to accommodate a preform 100 provided with an outer cylindrical surface and connected to an FPC 200. An end of the first mandrel 51 of each mold core assembly 5 and an end of the respective second mandrel 6 are connectable to two ends of the preform 100 respectively to support the preform 100 in the respective cavity 7.

The preform 100, the FPC 200, the upper mold 23, the lower mold 12, the mold core assembly 5 and the second mandrels 6 form a mold cavity coating the outer cylindrical surface of the preform 100. In the mold cavity, a coating 300 can be formed on the outer cylindrical surface of the preform 100 to coat the FPC 200.

The device for molding an FPC and a plastic part provided by the present disclosure includes a lower mold assembly, an upper mold assembly, at least one mold core assembly and at least one second mandrel. Each mold core assembly includes a first mandrel. The lower mold assembly includes a lower mold and the upper mold assembly includes an upper mold. The upper mold is disposed facing the lower mold in an up-down direction. At least one cavity formed at a junction of the lower mold and the upper mold. Each mold core assembly and the respective second mandrel correspond to a respective one of the least one cavity. Each first mandrel and the respective second mandrel can support a preform with an outer cylindrical surface and connected to an FPC in a respective cavity. The preform, the FPC, the upper mold, the lower mold, the mold core assembly and the second mandrel form a mold cavity coating the outer cylindrical surface of the preform, and a coating is formed on the outer cylindrical surface of the preform. By coating the FPC between the preform and coating, the FPC is tightly connected between the coating and the preform. Thus, the stability of the connection of the FPC is improved and the performance of FPC is better achieved. Moreover, the arrangement in which the FPC is built into a plastic part formed by the preform and the coating can improve the degree of general integration, reduce the volume of the product and simplify the structure of the product.

In this embodiment, by pre-using the first mandrel 51 and the second mandrel 6 to support the preform 100 connected to the FPC 200 in the cavity 7, the coating 300 can be formed on the outer cylindrical surface of the preform 100 to coat the FPC 200, so that the stability of the connection of the FPC 200 is improved. Optionally, the preform 100 is tubular so that it is convenient for the first mandrel 51 and the second mandrel 6 to be connected to the preform 100 in order to support the preform 100. Understandably, in some embodiments, one mold core assembly 5 and one second mandrel 6 correspond to one cavity 7, and the molding of the FPC and the plastic part can be achieved once each time. In other embodiments, a plurality of cavities 7, a plurality of mold core assemblies 5 and a plurality of the second mandrels 6 can be provided. The plurality of cavities 7 can be arranged in sequence and each cavity 7 corresponds to a respective one of the mold core assemblies 5 and a respective one of the second mandrels 6, so that the molding of the FPC 200 and the plastic part can be achieved a plurality of times each time and the processing efficiency can be improved.

Figure 8:
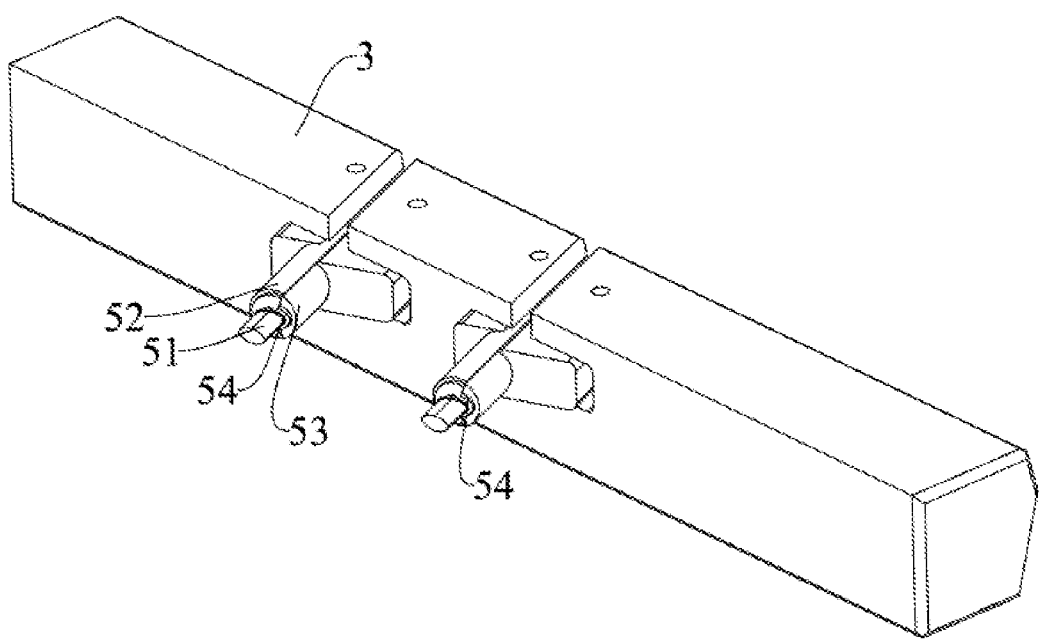
FIG. 8 is a perspective view illustrating the structure of FPCs and the mold bar and preforms of the device for molding an FPC and a plastic part according to an embodiment of the present disclosure.
Figure 9:
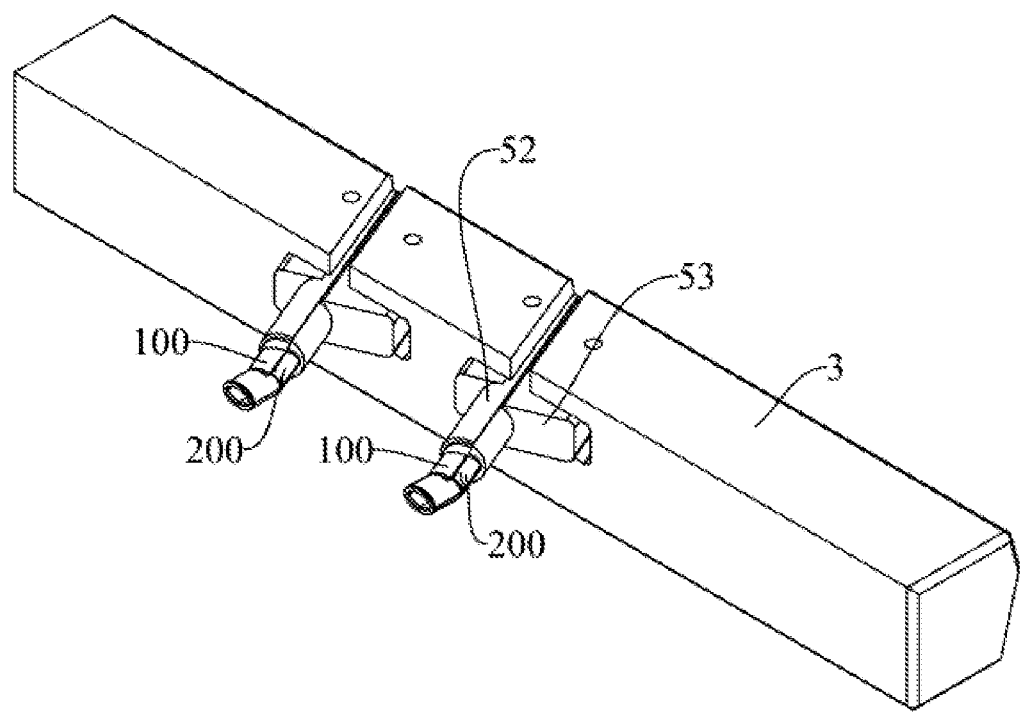
FIG. 9 is a perspective view illustrating the structure of plastic parts and FPCs molded by the device for molding an FPC and a plastic part according to an embodiment of the present disclosure.

As shown in FIG. 8 and FIG. 9, each mold core assembly 5 includes a fixed block 52 and a movable block 53 connectable to the fixed block 52. The first mandrel 51 is connected to an end of the fixed block 52. When the fixed block 52 is connected to the movable block 53, an installation slot 54 is formed between the fixed block 52 and the movable block 53. The installation slot 54 is used to cover a part of the FPC 200 not in contact with the preform 100. A support base 8 is disposed on the lower mold 12 and correspondingly disposed under the first mandrel 51 to support the first mandrel 51. Optionally, before placing the preform 100 connected to the FPC 200 into the cavity 7, the mold core assembly 5 needs to be picked out in order to sleeve one end of the preform 100 onto the first mandrel 51. A part of the FPC 200 not in contact with the preform 100 is covered in the installation slot 54. The fixed block 52 and the movable block 53 can protect the FPC 200 and the processing of the upper mold 23 and the lower mold 12 can be more convenient.

In this embodiment, the device for molding an FPC and a plastic part further includes a mold bar 3. A bottom of the upper mold 23 is provided with an upper slot 231 and a top of the lower mold 12 is provided with a lower slot 121 corresponding to the upper slot 231. The mold bar 3 is disposed between the upper slot 231 and the lower slot 121. at least one connection slot 31 is disposed in the mold bar 3. Each fixed block 52 and a respective movable block 53 are detachably disposed in a respective one of the at least one connection slot 31. The mold bar 3 can facilitate the installation and the detachment of the fixed block 52 and the movable block 53. When a plurality of mold core assemblies 5 are provided, a plurality of connection slots 31 can be correspondingly provided and each connection slot 31 contains one of the mold core assemblies 5, therefore the plurality of mold core assemblies 5 can be disposed in one mold bar 3 so that a plurality of preforms 100 connected to the FPCs 200 can be installed simultaneously and the processing efficiency can be improved.

In order to make the connection of the first mandrel 51 and the preform 100 connected to the FPC 200 more convenient, a gap is provided between a side of the movable block 53 away from the fixed block 52 and an inner wall of the connection slot 31. Optionally, the movable block 53 and the fixed block 52 are each detachably connected to the mold bar 3. When the preform 100 connected to the FPC 200 needs to be installed, the movable block can be detached and moved in the gap to enlarge the distance between the movable block 53 and the fixed block 52, so that it is convenient to install the FPC 200 into the installation slot 54. After the preform 100 connected to the FPC 200 is connected to the mold core assembly 5, the movable block 53 can be fixed.

Figure 4:
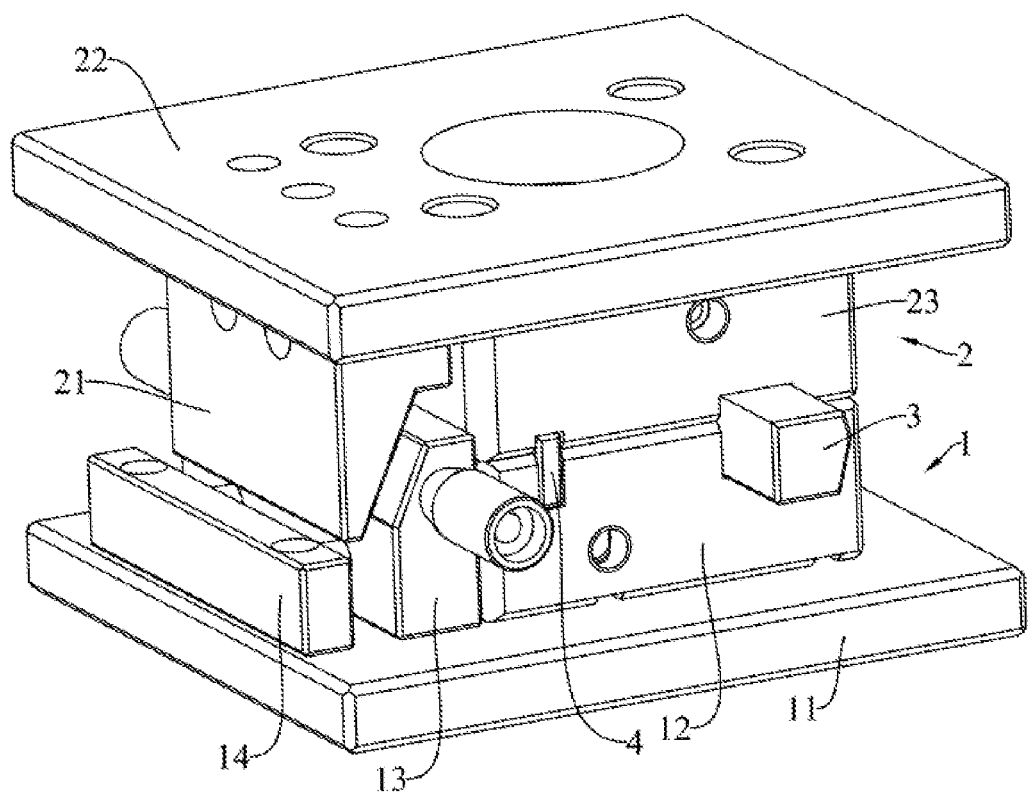
FIG. 4 is an exploded view illustrating the structure of the device for molding an FPC and a plastic part according to an embodiment of the present disclosure.
Figure 5:
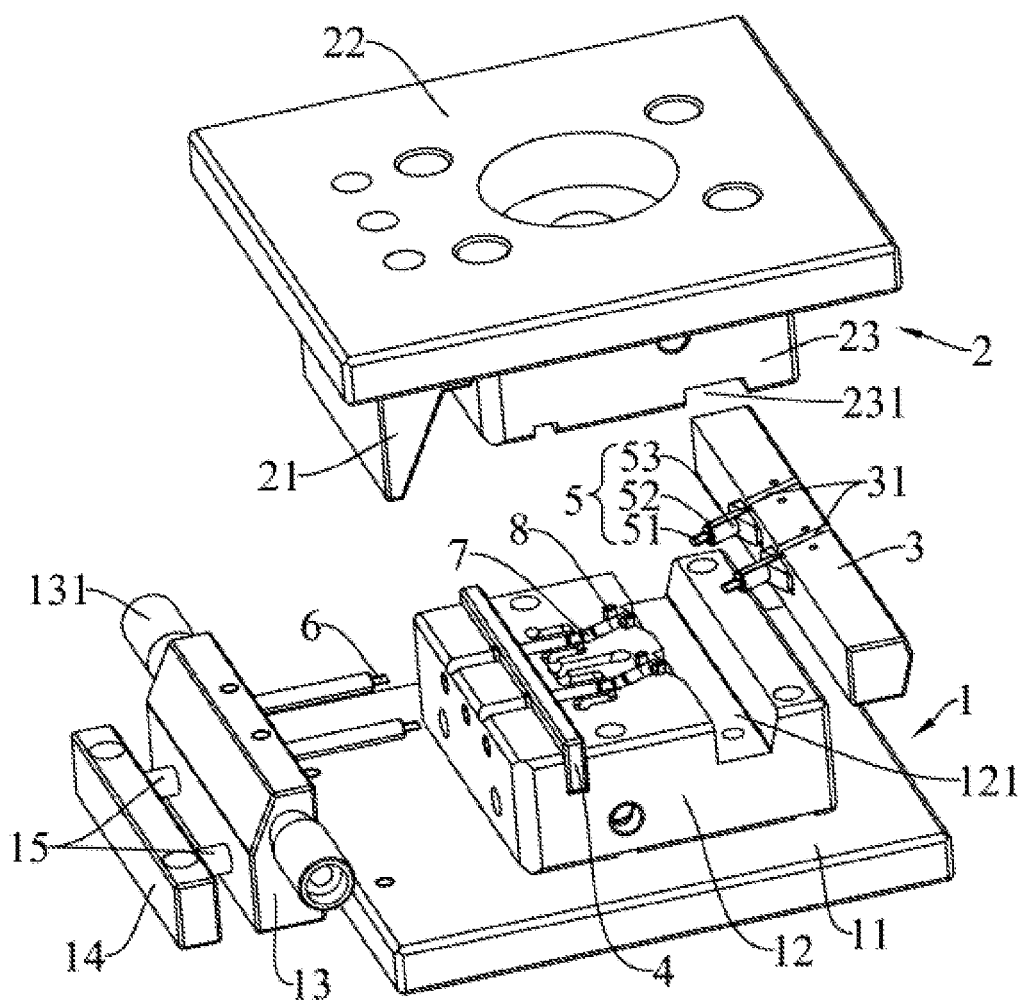
FIG. 5 is a perspective view illustrating the structure of a lower mold assembly of the device for molding an FPC and a plastic part and the structure of molded plastic parts according to an embodiment of the present disclosure.

As shown in FIG. 4 and FIG. 5, the lower mold assembly 1 further includes a slider 13 disposed on one side of the lower mold 12. A side of the slider 13 is provided with a handle 131, and in this embodiment, both sides of the slider 13 are provided with the handle 131. Another end of each second mandrel 6 is connected to the slider 13 and the slider 13 can drive the second mandrel 6 to slide along an axis direction of the second mandrel 6. Before placing the preform 100 connected to the FPC 200 into the cavity 7, the second mandrel 6 can be moved outwards by pushing the slider 13, so that the preform 100 connected to the FPC 200 can be placed into the cavity 7. After placing the preform with one end connected to the mold core assembly 5 into the cavity 7, the slider 13 can be pushed to connect the second mandrel 6 to the other end of the preform 100 connected to the FPC 200.

Figure 10:
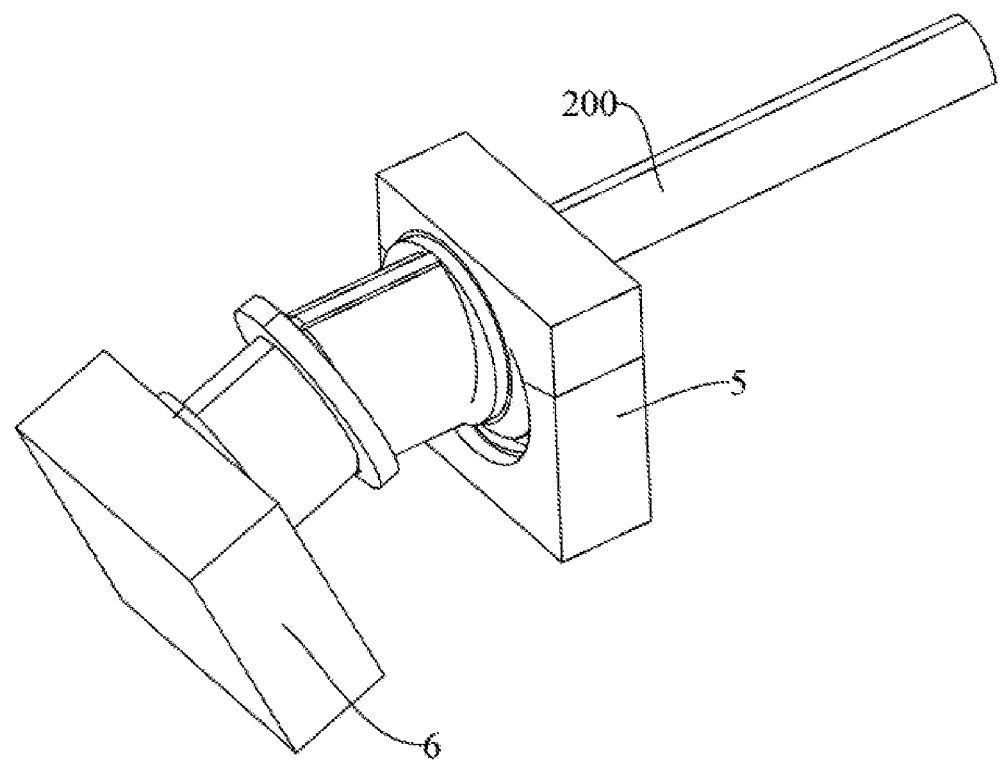
FIG. 10 is a perspective view illustrating the structure of a mold core assembly, a second mandrel, a molded plastic part and a molded FPC that are in another form according to an embodiment of the present disclosure.
Figure 11:
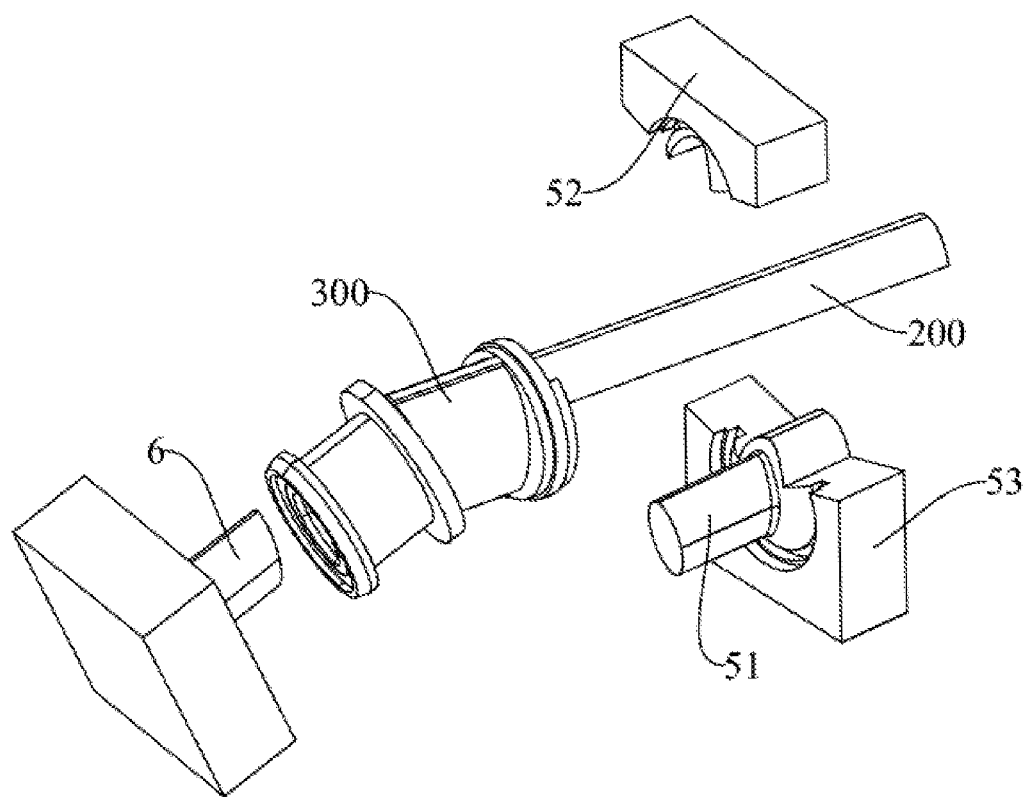
FIG. 11 is an exploded view illustrating the structure of the mold core assembly, the second mandrel, the molded plastic part and the molded FPC that are in another form according to an embodiment of the present disclosure.

As shown in FIG. 10 and FIG. 11, the mold bar 3 and the slider 13 connected to the second mandrel 6 can be simplified to improve the molding efficiency.

As shown in FIG. 4 and FIG. 5, a side of the slider 13 away from the lower mold 12 is provided with a mount 14. A guide pillar 15 penetrating the slider 13 is disposed between the mount 14 and the lower mold 12. The guide pillar 15 can guide the slider 13 to drive the second mandrel 6 to move stably.

Figure 6:
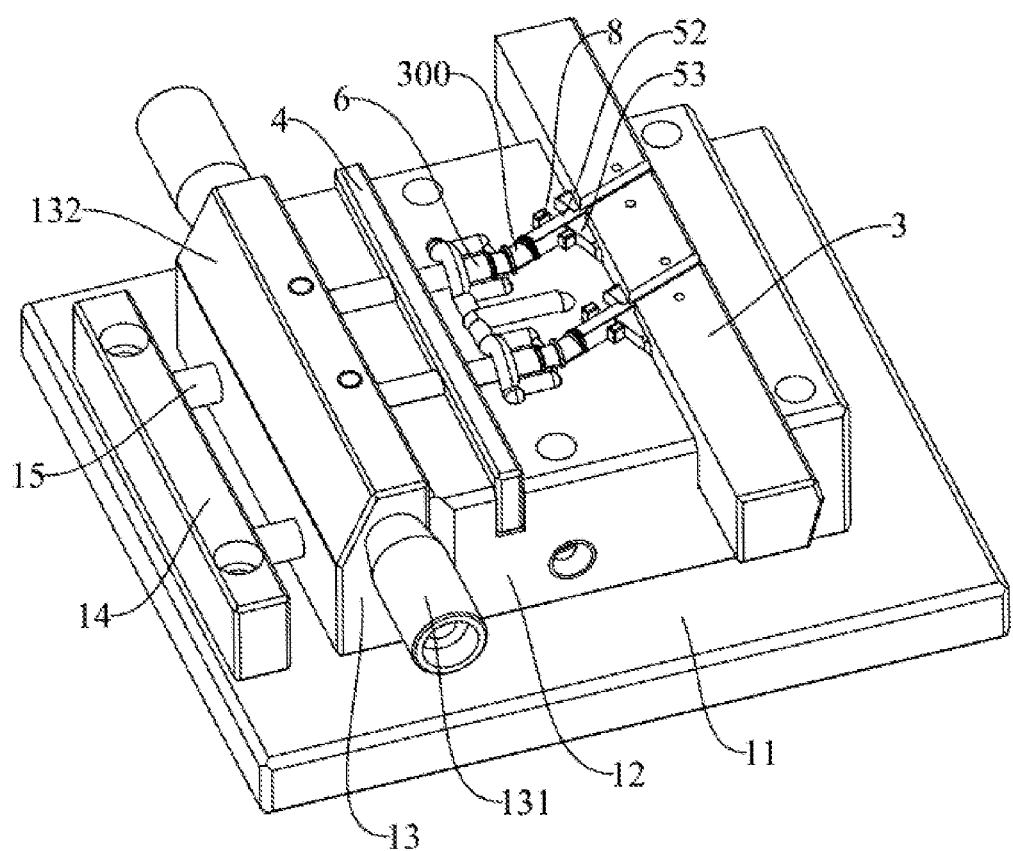
FIG. 6 is a perspective view illustrating the structure of an upper mold assembly of the device for molding an FPC and a plastic part according to an embodiment of the present disclosure.
Figure 7:
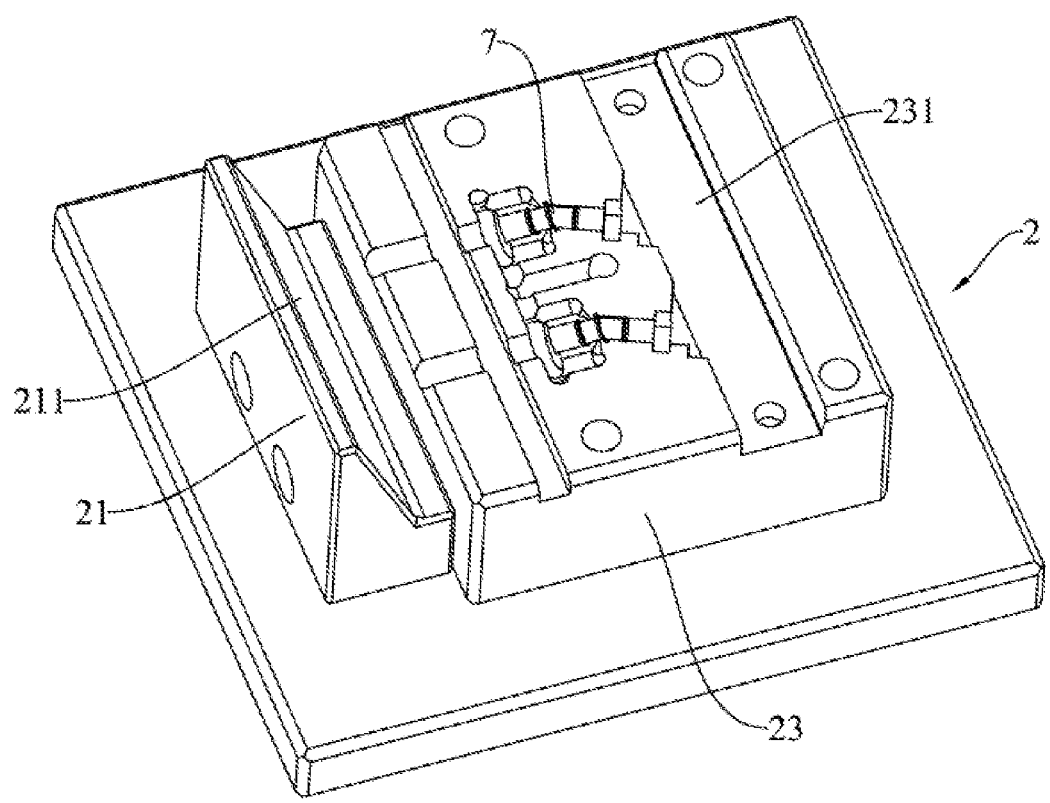
FIG. 7 is a perspective view illustrating the structure of a mold bar and mold core assemblies of the device for molding an FPC and a plastic part according to an embodiment of the present disclosure.

As shown in FIG. 4 to FIG. 6, the upper mold assembly 2 further includes a wedge block 21. The wedge block 21 is connected to a side of the upper mold 23 facing the slider 13. The wedge block 21 is provided with an upper abutment surface 211 and the slider 13 is provided with a lower abutment surface 132. When the wedge block 21 moves toward the slider 13, by abutting against the lower abutment surface 132, the upper abutment surface 211 can drive the slider 13 to move toward the lower mold 12. When the upper mold assembly 2 moves toward the lower mold assembly 1, the upper abutment surface 211 of the wedge block 21 can abut against the lower abutment surface 132 and the slider 13 can be tightly connected to the lower mold 12, so that the second mandrel 6 can be reliably connected to the preform 100 in the cavity 7, so that the coating 300 is formed on the preform 100 connected to the FPC 200 by processing.

Optionally, when the length of the second mandrel 6 is longer, a guide plate 4 is clamped between the upper mold 23 and the lower mold 12 and on a side adjacent to the slider 13. The second mandrel 6 can slide through the guide plate 4. The guide plate 4 may be used to guide and fix the second mandrel 6.

When using the device for molding an FPC and a plastic part provided by the present disclosure, the preform 100 is preprocessed by injection molding and the FPC 200 is connected to the outer cylindrical surface of the preform 100. The mold bar 3 is manually picked out and the preform 100 connected to the FPC 200 is connected to the first mandrel 51. When the installation of the preform 100 of the FPC 200 is finished, the mold bar 3 is placed into the lower slot 121. Meanwhile, the preform 100 is placed into the cavity 7. The slider 13 is pushed to connect the second mandrel 6 to the other end of the preform 100. The upper mold assembly 2 and the lower mold assembly 1 are combined, so that the coating 300 is formed on the preform 100 connected to the FPC 200 by injection molding. The present disclosure achieves the molding of an FPC 200 and a plastic part formed by the preform 100 and the coating 300 integrally. By coating the FPC 200 between the preform 100 and coating 300, the FPC 200 is tightly connected between the coating 300 and the preform 100. Thus, the stability of the connection of the FPC 200 is improved and the performance of FPC 200 is better achieved. Moreover, the arrangement in which the FPC 200 is built into a plastic part formed by the preform 100 and the coating 300 can improve the degree of general integration, reduce the volume of the product and simplify the structure of the product.

What is claimed is:

1. A device for molding a flexible printed circuit (FPC) and a plastic part, comprising:
   a lower mold assembly, comprising a lower mold;
   an upper mold assembly, comprising an upper mold, wherein the upper mold is disposed facing the lower mold;
   at least one mold core assembly, disposed between the upper mold and the lower mold, wherein each of the at least one mold core assembly comprises a first mandrel;
   at least one second mandrel, disposed between the upper mold and the lower mold, wherein each of the at least one second mandrel is facing a respective one of the at least one mold core assembly; and
   at least one cavity, formed at a junction of the lower mold and the upper mold, wherein each mold core assembly and the respective second mandrel correspond to a respective one of the least one cavity, each of the at least one cavity is disposed between the respective mold core assembly and the respective second mandrel and is configured to accommodate a preform which is provided with an outer cylindrical surface and is connected to the FPC, and an end of the first mandrel of each mold core assembly and an end of the respective second mandrel are connectable to two ends of the preform respectively to support the preform in the respective cavity;
   wherein the preform, the FPC, the upper mold, the lower mold, each mold core assembly and the respective second mandrel form a mold cavity for coating the outer cylindrical surface of the preform, and the mold cavity is configured to form a coating on the outer cylindrical surface of the preform to coat the FPC.

2. The device of claim 1, wherein each of the at least one mold core assembly further comprises a fixed block and a movable block connectable to the fixed block, the first mandrel is connected to an end of the fixed block; and in a case where the fixed block is connected to the movable block, an installation slot is formed between the fixed block and the movable block, and the installation slot is configured to cover a part of the FPC not in contact with the preform.

3. The device of claim 2, further comprising a mold bar, wherein
   a bottom of the upper mold is provided with an upper slot and a top of the lower mold is provided with a lower slot corresponding to the upper slot, the mold bar is disposed between the upper slot and the lower slot, at least one connection slot spaced apart is disposed in the mold bar, and the fixed block and the movable block are detachably disposed in a respective one of the at least one connection slot respectively.

4. The device of claim 3, wherein a gap is provided between a side of the movable block away from the fixed block and an inner wall of the respective one of the at least one connection slot.

5. The device of claim 1, wherein the lower mold assembly further comprises a slider disposed on one side of the lower mold, the other end of each second mandrel is connected to the slider, and the slider is configured to drive the at least one second mandrel to slide along an axial direction of the at least one second mandrel.

6. The device of claim 5, further comprising: a mount disposed on a side of the slider away from the lower mold, and a guide pillar penetrating the slider is disposed between the mount and the lower mold.

7. The device of claim 5, wherein the upper mold assembly further comprises a wedge block, the wedge block is connected to a side of the upper mold facing the slider, the wedge block is provided with an upper abutment surface and the slider is provided with a lower abutment surface; and the upper abutment surface is configured to drive, by abutting against the lower abutment surface, the slider to move toward the lower mold in a case where the wedge block moves toward the slider.

8. The device of claim 5, further comprising a guide plate, wherein the guide plate is clamped between the upper mold and the lower mold and is at a side adjacent to the slider, and the at least one second mandrel is configured to slide through the guide plate.

9. A method for molding a flexible printed circuit (FPC) and a plastic part, comprising:
preprocessing a preform and connecting the FPC to an outer cylindrical surface of the preform; and
forming a coating on the outer cylindrical surface of the preform by using a device for molding the flexible printed circuit and the plastic part;
wherein the device comprises:
a lower mold assembly, comprising a lower mold;
an upper mold assembly, comprising an upper mold, wherein the upper mold is disposed facing the lower mold;
at least one mold core assembly, disposed between the upper mold and the lower mold, wherein each of the at least one mold core assembly comprises a first mandrel;
at least one second mandrel, disposed between the upper mold and the lower mold, wherein each of the at least one second mandrel is facing a respective one of the at least one mold core assembly; and
at least one cavity, formed at a junction of the lower mold and the upper mold, wherein each mold core assembly and the respective second mandrel correspond to a respective one of the least one cavity, each of the at least one cavity is disposed between the respective mold core assembly and the respective second mandrel and is configured to accommodate the preform which is provided with the outer cylindrical surface and is connected to the FPC, and an end of the first mandrel of each mold core assembly and an end of the respective second mandrel are connectable to two ends of the preform respectively to support the preform in the respective cavity;

wherein the preform, the FPC, the upper mold, the lower mold, each mold core assembly and the respective second mandrel form a mold cavity for coating the outer cylindrical surface of the preform, and the mold cavity is configured to form the coating on the outer cylindrical surface of the preform to coat the FPC.

10. The method of claim 9, wherein each of the at least one mold core assembly further comprises a fixed block and a movable block connectable to the fixed block, the first mandrel is connected to an end of the fixed block; and in a case where the fixed block is connected to the movable block, an installation slot is formed between the fixed block and the movable block, and the installation slot is configured to cover a part of the FPC not in contact with the preform.

11. The method of claim 10, wherein the device further comprises a mold bar; and
wherein a bottom of the upper mold is provided with an upper slot and a top of the lower mold is provided with a lower slot corresponding to the upper slot, the mold bar is disposed between the upper slot and the lower slot, at least one connection slot spaced apart is disposed in the mold bar, and the fixed block and the movable block are detachably disposed in a respective one of the at least one connection slot respectively.

12. The method of claim 11, wherein a gap is provided between a side of the movable block away from the fixed block and an inner wall of the respective one of the at least one connection slot.

13. The method of claim 9, wherein the lower mold assembly further comprises a slider disposed on one side of the lower mold, the other end of each second mandrel is connected to the slider, and the slider is configured to drive the at least one second mandrel to slide along an axial direction of the at least one second mandrel.

14. The method of claim 13, wherein the device further comprises: a mount disposed on a side of the slider away from the lower mold, and a guide pillar penetrating the slider is disposed between the mount and the lower mold.

15. The method of claim 13, wherein the upper mold assembly further comprises a wedge block, the wedge block is connected to a side of the upper mold facing the slider, the wedge block is provided with an upper abutment surface and the slider is provided with a lower abutment surface; and the upper abutment surface is configured to drive, by abutting against the lower abutment surface, the slider to move toward the lower mold in a case where the wedge block moves toward the slider.

16. The method of claim 13, wherein the device further comprises a guide plate, the guide plate is clamped between the upper mold and the lower mold and is at a side adjacent to the slider, and the at least one second mandrel is configured to slide through the guide plate.

17. The method of claim 9, wherein the outer cylindrical surface of the preform is provided with a clamp slot surrounding the preform, and an end of the FPC is disposed around the clamp slot and in the clamp slot for connecting to the preform.

* * * * *